(12) United States Patent
Rudeck

(10) Patent No.: US 6,916,707 B2
(45) Date of Patent: Jul. 12, 2005

(54) HIGH COUPLING FLOATING GATE TRANSISTOR

(75) Inventor: Paul Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/727,887

(22) Filed: Dec. 4, 2003

(65) Prior Publication Data

US 2004/0110362 A1 Jun. 10, 2004

Related U.S. Application Data

(63) Continuation of application No. 10/224,915, filed on Aug. 21, 2002, now Pat. No. 6,762,093.

(51) Int. Cl.$^7$ .............................................. H01L 21/336
(52) U.S. Cl. ...................... 438/257; 438/259; 438/260; 438/588; 438/593; 438/639
(58) Field of Search ................................ 438/211, 257, 438/259, 260, 588, 593, 594, 639

(56) References Cited

U.S. PATENT DOCUMENTS

| | | | |
|---|---|---|---|
| 4,757,360 A * | 7/1988 | Faraone ...................... 257/317 |
| 4,864,464 A | 9/1989 | Gonzalez |
| 5,192,872 A | 3/1993 | Lee |
| 5,281,548 A * | 1/1994 | Prall ........................... 438/259 |
| 5,354,705 A | 10/1994 | Mathews et al. |
| 5,444,279 A | 8/1995 | Lee |
| 5,480,820 A * | 1/1996 | Roth et al. .................. 438/257 |
| 5,732,014 A | 3/1998 | Forbes |
| 5,880,991 A * | 3/1999 | Hsu et al. .................... 365/182 |
| 5,897,351 A | 4/1999 | Forbes |
| 5,914,511 A | 6/1999 | Noble |
| 5,981,335 A | 11/1999 | Chi |
| 6,051,467 A * | 4/2000 | Chan et al. .................. 438/264 |
| 6,066,869 A | 5/2000 | Noble |
| 6,156,607 A | 12/2000 | Noble |
| 6,272,047 B1 | 8/2001 | Mihnea |
| 6,297,989 B1 | 10/2001 | Cloud |
| 6,323,085 B1 | 11/2001 | Sandhu |
| 6,323,514 B1 * | 11/2001 | Kao ............................ 257/315 |
| 6,329,240 B1 * | 12/2001 | Hsu et al. .................... 438/253 |
| 6,329,277 B1 * | 12/2001 | Liu et al. ..................... 438/612 |
| 6,376,310 B1 * | 4/2002 | Kim ............................ 438/263 |
| 6,384,447 B2 | 5/2002 | Mihnea |
| 6,413,818 B1 | 7/2002 | Huang et al. |
| 6,448,615 B1 | 9/2002 | Forbes |
| 6,461,915 B1 | 10/2002 | Rudeck |
| 6,537,880 B1 * | 3/2003 | Tseng .......................... 438/260 |
| 6,764,905 B2 * | 7/2004 | Jeng et al. ................... 438/267 |
| 2002/0017680 A1 * | 2/2002 | Na et al. ..................... 257/315 |
| 2002/0079523 A1 | 6/2002 | Zheng |

* cited by examiner

*Primary Examiner*—Mary Wilczewski
*Assistant Examiner*—Toniae M. Thomas
(74) *Attorney, Agent, or Firm*—Leffert, Jay & Polglaze, P.A.

(57) ABSTRACT

The present invention provides methods of fabricating floating gate transistors. One method includes forming laterally spaced source and drain regions to define a channel therebetween, forming a first floating gate portion above the channel region, the first floating gate portion extending in a general horizontal direction, forming spacers over the first floating gate portion to define an exposed region on the first floating gate portion, forming a contact coupled to the first floating gate portion at the exposed region, the contact extending vertically above the first portion, forming a second floating gate portion coupled to the contact, the second floating gate portion extending in a general vertical direction, and forming a control gate adjacent to the second portion.

17 Claims, 12 Drawing Sheets

HIGH COUPLING FLOATING GATE TRANSISTOR

RELATED APPLICATION

This is a continuation application of U.S. patent application Ser. No. 10/224,915 (allowed), filed Aug. 21, 2002, now U.S. Pat. No. 6,762,093 titled "HIGH COUPLING FLOATING GATE TRANSISTOR" and commonly assigned, the entire contents of which are incorporated herein by reference.

FIELD OF THE INVENTION

The present invention relates generally to memory devices and in particular the present invention relates to non-volatile memory cells.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

As semiconductor devices get smaller in size, designers are faced with problems associated with the production of memory cells that consume a small enough amount of surface area to meet design criteria, yet maintain sufficient performance in spite of this smaller size. In the DRAM art, one type of memory cell capacitor that has proven successful in this regard is the container capacitor, which is so named for its container-like appearance. The capacitor has a bottom electrode that is fabricated to resemble a container having upwardly extending sidewalls to define a central recess, or opening. A layer of dielectric is formed over the bottom electrode and then a top electrode is fabricated over the dielectric. The amount of capacitive between the electrodes, coupling per die area, is substantially increased over non-container capacitors.

For the reasons stated above, and for other reasons stated below which will become apparent to those skilled in the art upon reading and understanding the present specification, there is a need in the art for a non-volatile memory cell that can be reduced to occupy less die area and maintain operating performance.

SUMMARY OF THE INVENTION

The above-mentioned problems with non-volatile memory cells and other problems are addressed by the present invention and will be understood by reading and studying the following specification.

One embodiment of the present invention provides a method of fabricating a floating gate transistor including forming laterally spaced source and drain regions to define a channel therebetween, forming a first floating gate portion above the channel region, the first floating gate portion extending in a general horizontal direction, forming spacers over the first floating gate portion to define an exposed region on the first floating gate portion, forming a contact coupled to the first floating gate portion at the exposed region, the contact extending vertically above the first portion, forming a second floating gate portion coupled to the contact, the second floating gate portion extending in a general vertical direction, and forming a control gate adjacent to the second portion.

DETAILED DESCRIPTION OF THE DRAWINGS

Figure 1:
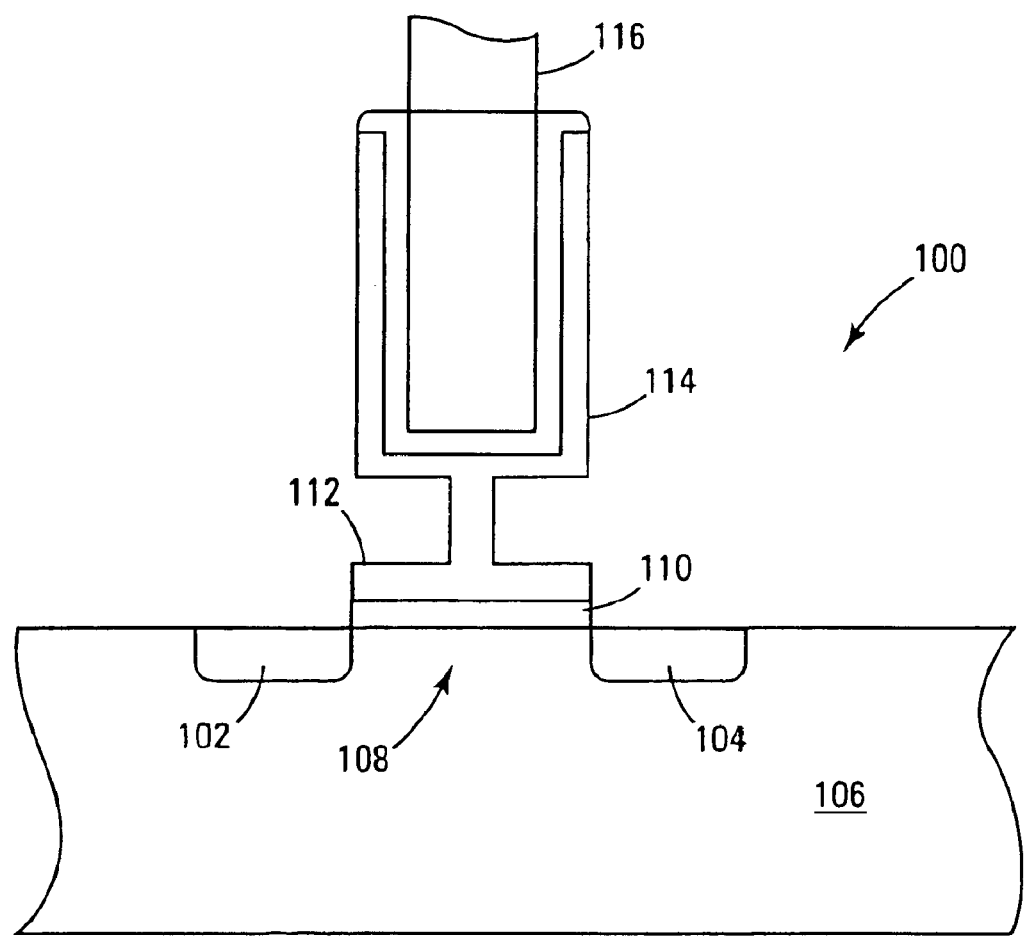
FIG. 1 is a cross-section of a floating gate transistor of one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

In addition, as the structures formed by embodiments in accordance with the present invention are described herein, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed.

The term conductor is understood to also include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

Non-volatile memory cells, as explained above, can be formed as floating gate transistors. While the area of the transistors can be reduced, the coupling ratio between the floating gate and the control gate is also reduced. Generally, as the gate-coupling ratio between the floating gate and the control gate decreases, the work voltage necessary to operate the memory transistor increases. As a consequence, the operational speed and efficiency of the flash memory decrease tremendously.

Some methods for increasing the gate-coupling ratio include: increasing the overlapped area between the floating and the control gate, reducing the thickness of the dielectric layer between the floating gate and the control gate, and increasing the dielectric constant (k) of the dielectric layer between the floating gate and the control gate. Generally, to achieve an increase in the overlapped area between the floating and control gates and thus increase the gate-coupling ratio, the size of the floating gate has to be increased. However, this is not desirable for the demands of today's highly-integrated technologies.

Embodiments of the present invention provide a floating gate transistor that can occupy less memory die area while maintaining a large gate-coupling ratio. As explained below, the floating and control gates are formed substantially in a vertical direction. In one embodiment, the floating gate is partially formed as a container.

Referring to FIG. 1, a cross section view of one embodiment of a floating gate transistor 100 of the present invention is illustrated. The transistor includes a source region 102 and a drain region 104 formed in a substrate 106. The source and drain regions are laterally spaced apart to define a channel region 108. A tunnel oxide 110 is formed over the channel region and a first floating gate structure 112 is formed over the tunnel oxide. A second floating gate structure 114 is vertically formed over the first floating gate structure. The second floating gate structure is fabricated in a container shape. The container-shaped second floating gate structure is electrically insulated from a control gate 116 formed at least within the center region of the container. While the floating gate is described herein as having first and second structures, it will be appreciated that the floating gate is one integral structure that can be fabricated in stages. As such, the term structure as used with the formation of the floating gate refers to a portion of the floating gate and not separate units.

The transistor of FIG. 1 can occupy less substrate area than traditional floating gate transistors while maintaining good coupling between the floating and control gates. The floating gate container can be fabricated using methods similar to DRAM container capacitor fabrication. For example, the floating gate container 114 can be fabricated with a hemi-spherical grain (HSG) to increase its surface area. The present invention is not limited to any specific fabrication technique or container shape. Any method or shape that provides coupling surfaces of the floating gate and the control gate primarily in a vertical direction can be used. One example fabrication is described in detail with reference to FIGS. 2 to 8A.

Figure 2:
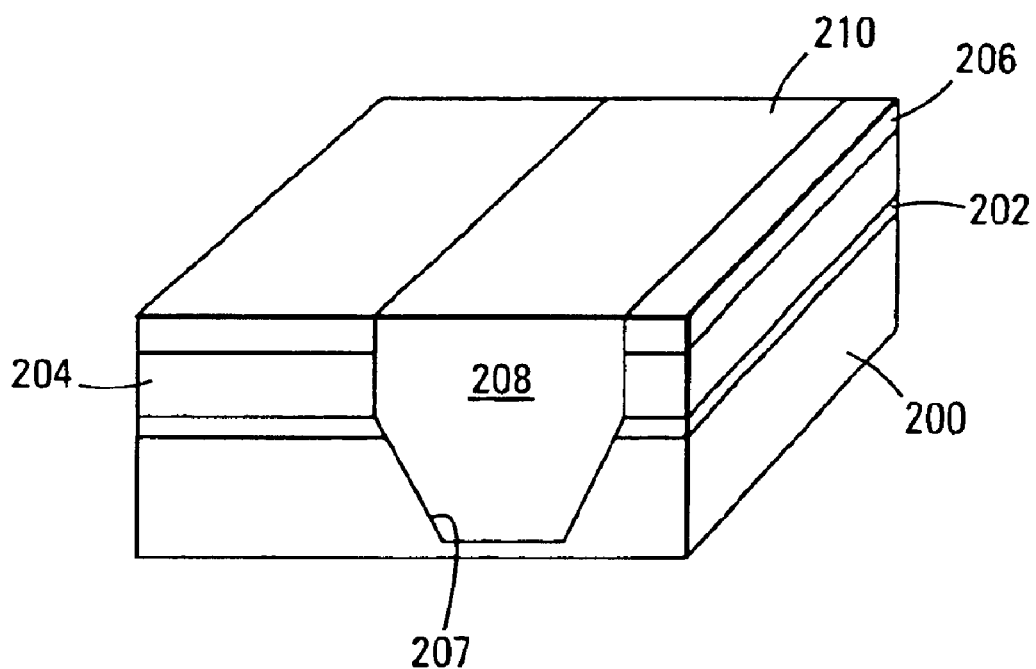
FIG. 2 is a cross-section perspective view of an in-process floating gate transistor of one embodiment of the present invention.

Referring to FIG. 2, a simplified perspective and cross-section view of a transistor of an embodiment of the present invention during fabrication. The transistor is fabricated with a substrate 200. A layer of tunnel oxide 202 is grown on the substrate and a first polysilicon layer 204 is deposited over the tunnel oxide. A layer of nitride 206 is deposited over the polysilicon 204. The nitride is patterned and a trench 207 is etched through the layers and into the substrate 200. The trench is filled with an oxide 208. Two types of oxide can be used, where a first oxide is grown in the trench and a second oxide is deposited in the etched layers. A chemical-mechanic planarization (CMP) operation is then performed to provide a uniform top surface 210.

Figure 3A:
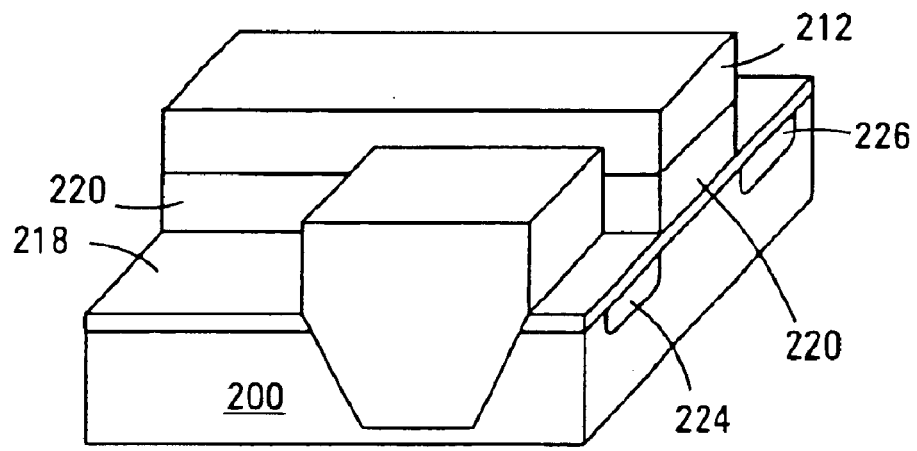
FIG. 3A is a cross-section perspective view of the in-process floating gate transistor of FIG. 2.
Figure 3B:
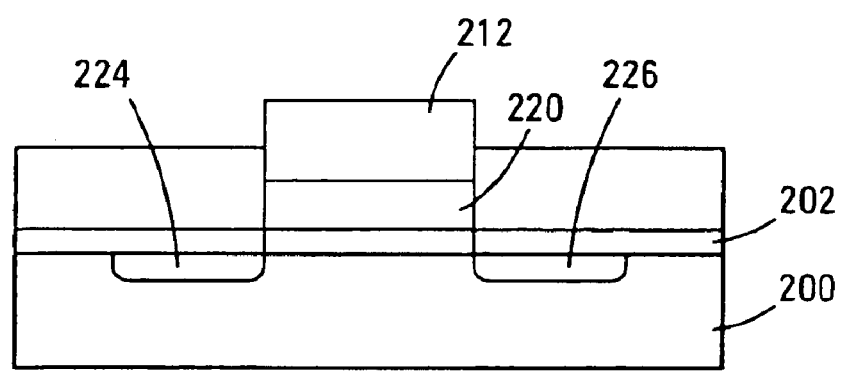
FIG. 3B is a cross-section side view of the transistor of FIG. 3A.

Referring to FIG. 3A, a second layer of nitride 212 is deposited over the CMP surface 210. The nitride is patterned and etched to remove portions of the polysilicon layer in regions 218. The pattern runs generally perpendicular to the trenches 206 to form the first floating gate structures 220. Source 224 and drain 226 regions are then implanted into the substrate in the regions where the polysilicon layer has been removed. FIG. 3B is a side cross-section that more clearly illustrates the implant areas.

Figure 4A:
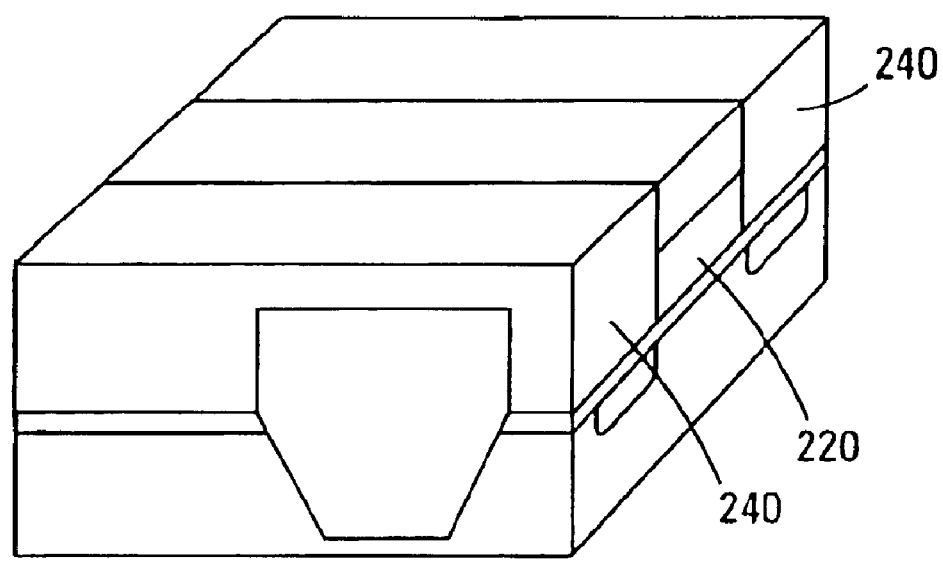
FIG. 4A is a cross-section perspective view of the in-process floating gate transistor of FIG. 3A.
Figure 4B:
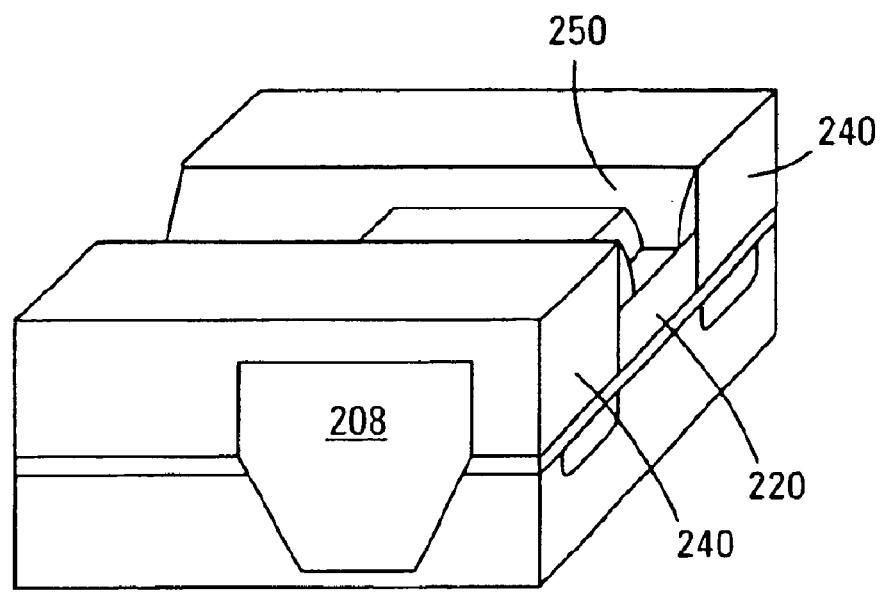
FIG. 4B is a cross-section perspective view of the in-process floating gate transistor of FIG. 4A.
Figure 4C:
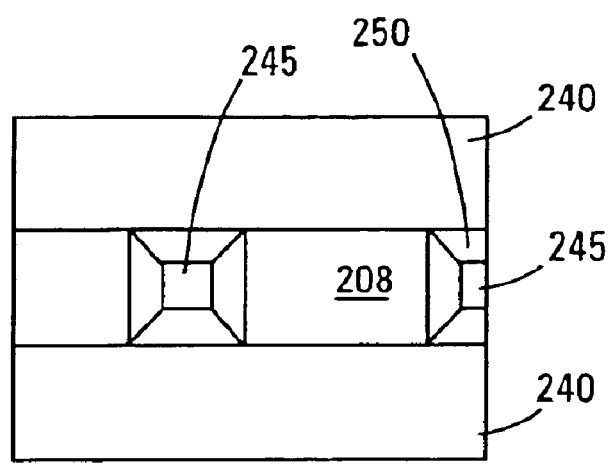
FIG. 4C is a top view of two in-process transistors illustrating self-aligning oxide spacers.

The etched regions 218 are then filled with an oxide 240 and the structure is again planarized with a CMP operation, see FIG. 4A. An etch operation is performed on the nitride layers 210/212 to form spacers 250 on the edges of the oxide layers 208 and 240, see FIG. 4B. The etch is performed until an area 245 of the first floating gate structures 220 is exposed. The exposed area is relatively aligned with the first floating gate structure. That is, because the oxide layers have different heights, the nitride spacers may prevent the opening from being fully aligned with the first floating gate structure. FIG. 4C is a top view of two transistors illustrating the spacers use to provide a self aligned guide to the first floating gate structures.

Figure 5A:
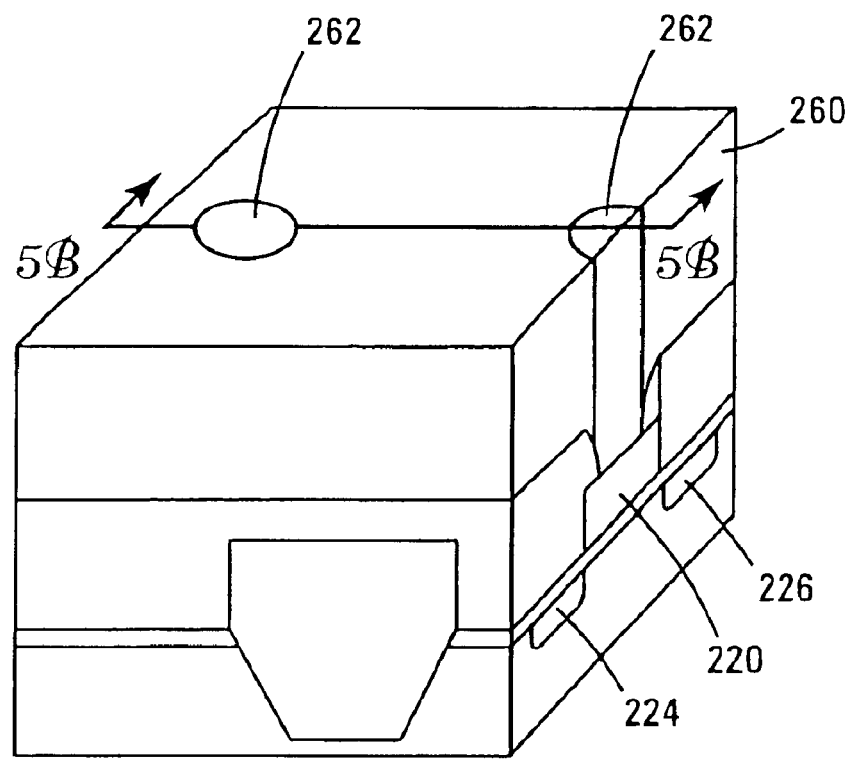
FIG. 5A is a cross-section perspective view of the in-process floating gate transistor of FIG. 4B.
Figure 5B:
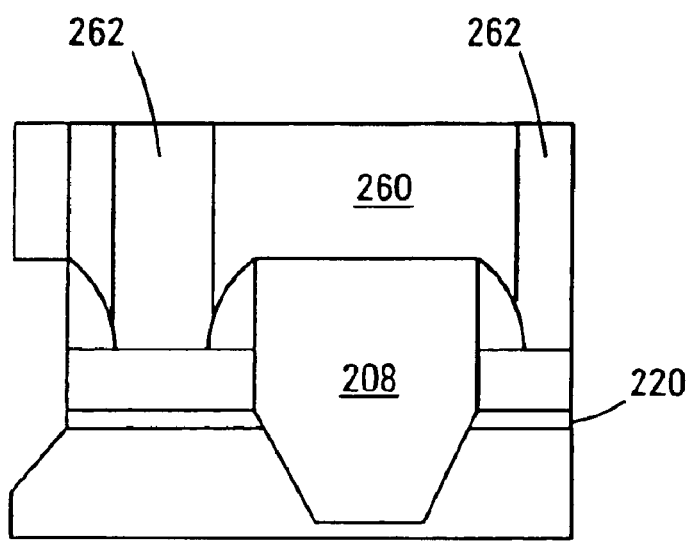
FIG. 5B is a cross-section view of the in-process floating gate transistor of FIG. 5A along line 5B—5B.

A dielectric layer 260 is then formed over the etched structures, see FIGS. 5A and 5B. The dielectric layer may comprise boro-phospho-silicate glass (BPSG) or phospho-silicate glass (PSG). Alternatively, other low dielectric constant materials may be used. Contact openings (not shown) are etched through the dielectric layer to the first floating gate structures. Polysilicon is then deposited in the contact openings to form contacts 262 and perform a CMP operation. FIG. 5A provides a good illustration of the early stage of the transistor. The source 224, drain 226, first floating gate structure 220 and floating gate contact 262 are illustrated. The first structure 220 and contact 262 form one integral floating gate of polysilicon material.

Figure 6A:
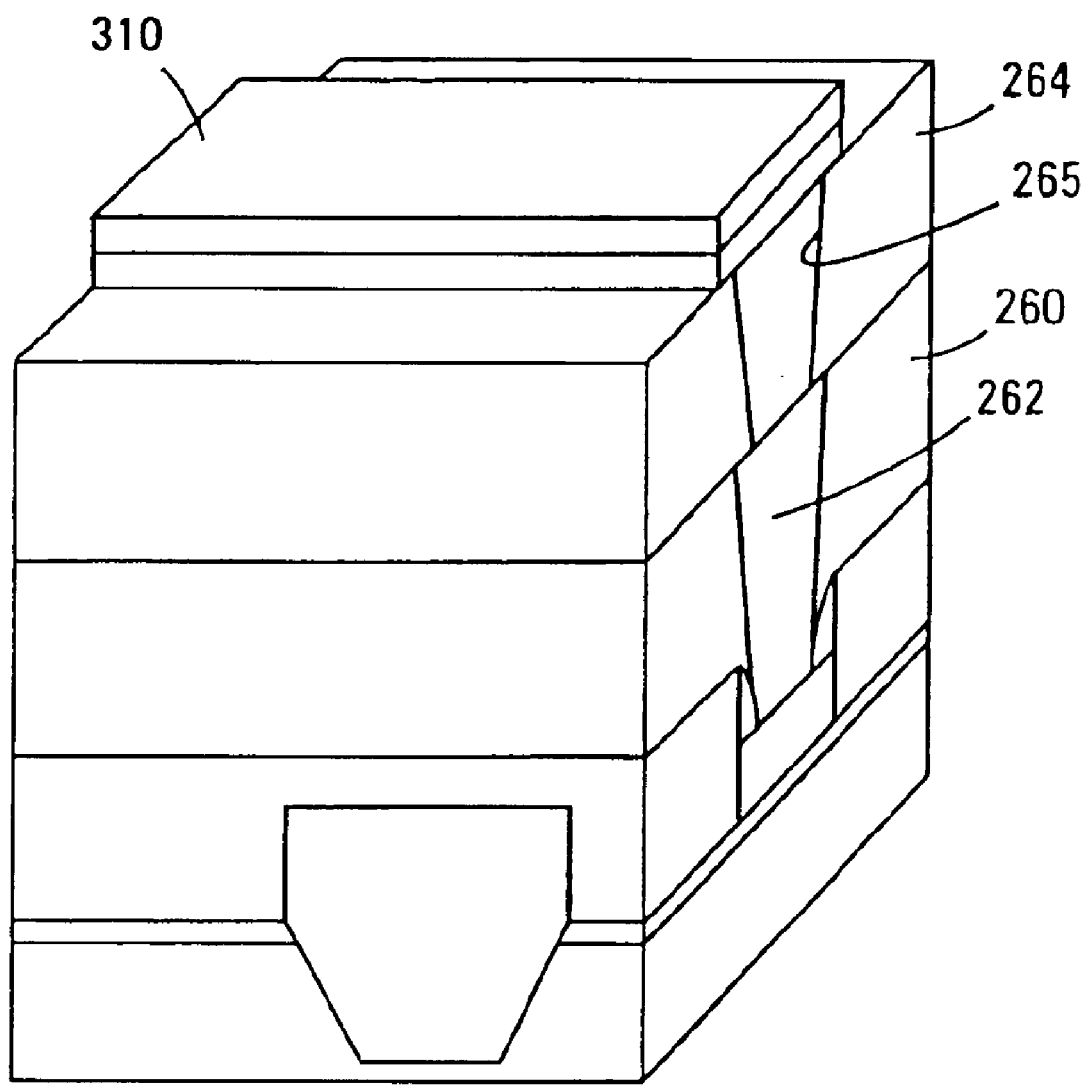
FIG. 6A is a cross-section perspective view of the in-process floating gate transistor of FIG. 5A.
Figure 6B:
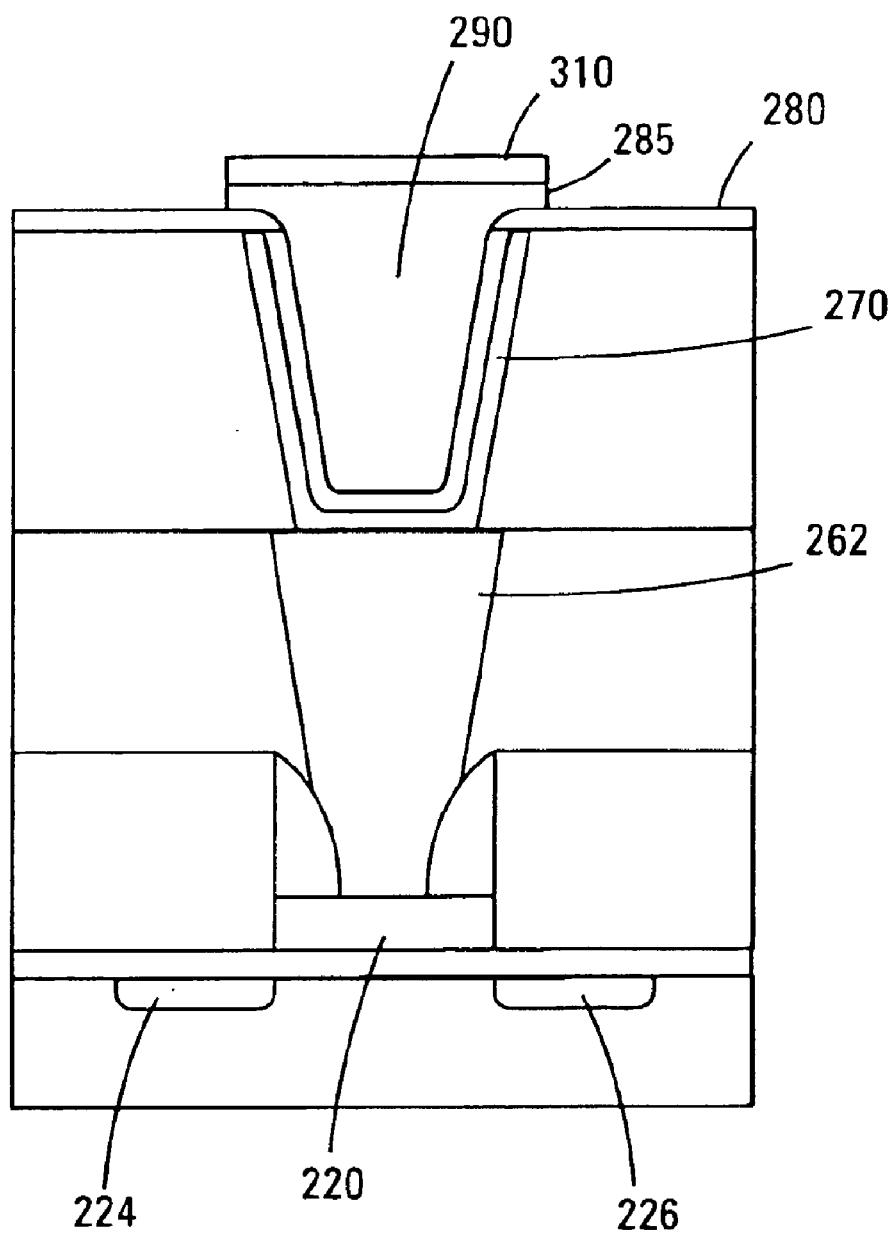
FIG. 6B is a cross-section side view of the transistor of FIG. 6A.
Figure 7:
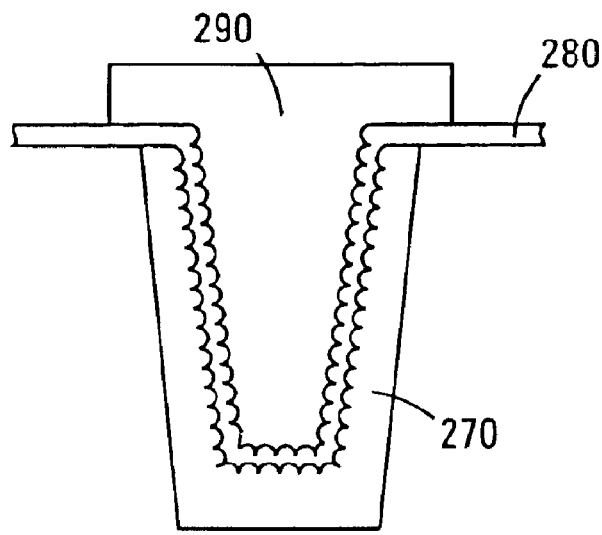
FIG. 7 illustrates an alternative embodiment of a portion of a floating gate transistor of the present invention.

Referring to FIGS. 6A and 6B a second dielectric layer 264 is formed over the planarized structure. The dielectric is patterned and etched to form container openings 265 in the second dielectric layer and in alignment with the floating gate contacts 262. Polysilicon is deposited in the container openings to form a layer that does not fill the container opening. That is, the polysilicon covers the container opening 265 in the dielectric 264 and leaves an opening to form the control gate in the container. A CMP operation is then performed to remove the polysilicon that was deposited on the second dielectric layer. As such, the second floating gate structure 270 is formed and in contact with the first floating gate 220 structure via the contact 262. The floating gate, therefore, includes 220, 262 and 270 which form a single floating gate.

An oxide layer 280, such as an oxide-nitride-oxide (ONO) thin film dielectric, is deposited to insulate the second floating gate structure 220 and a polysilicon layer 285 is deposited to form the control gate 290. A layer of tungsten is deposited on the second polysilicon. The tungsten and second polysilicon are patterned and etched to form word lines 310.

The above-described method of fabricating a transistor is merely one embodiment of the present invention. The source and drain region contacts have not been described, but can be provide in either a NAND or NOR manner, as known to those skilled in the art. The second floating gate structure 270 can be formed with HSG to increase the second floating gate structure surface area, see FIG. 7. As such, those skilled in the art, with the benefit of the present invention will recognize that numerous methods of forming a floating gate transistor with a vertical floating gate can be implemented without departing from the present invention. In addition, the control gate can be fabricated to couple to the exterior of the floating gate container, see FIG. 8A.

Figure 9:
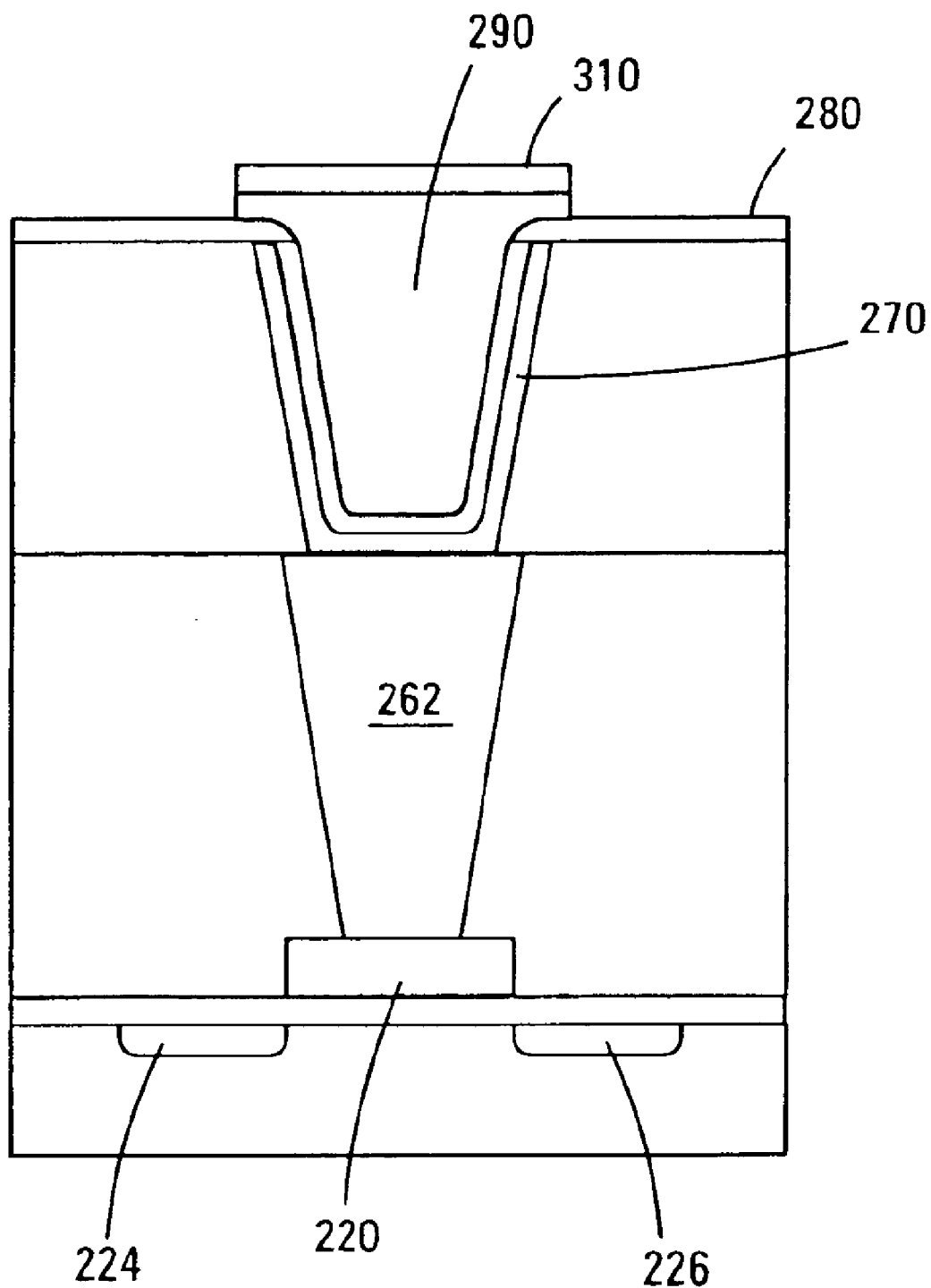
FIG. 9 is a cross-section view of an alternate embodiment of a transistor of the present invention.

The contact between the container structure and the horizontally extending floating gate structure above the channel region can be formed without using a self-aligned process. Referring to FIG. 9, a cross-section perspective view of a simplified transistor array according to another embodiment of the present invention is described. The substrate has been processed in a manner similar to the above-described process. That is, isolation trenches, tunnel oxide, source and drain regions, and horizontal floating gate structures have been fabricated. A dielectric layer, such as BPSG, is formed and patterned for contacts. The contact vias are etched and a polysilicon material is deposited to fill the contact vias. After a CMP operation, the floating gate containers and control gates are fabricated similar to the processes described above. A primary difference in this method is that the floating gate contacts are not 'self aligned' to the horizontal floating gate structure using oxide spacers.

Figure 8A:
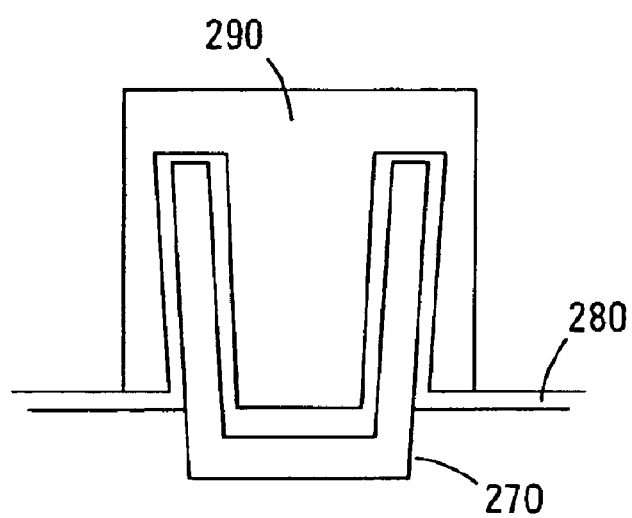
FIG. 8A illustrates an alternative embodiment of a portion of a floating gate transistor of the present invention.
Figure 8B:
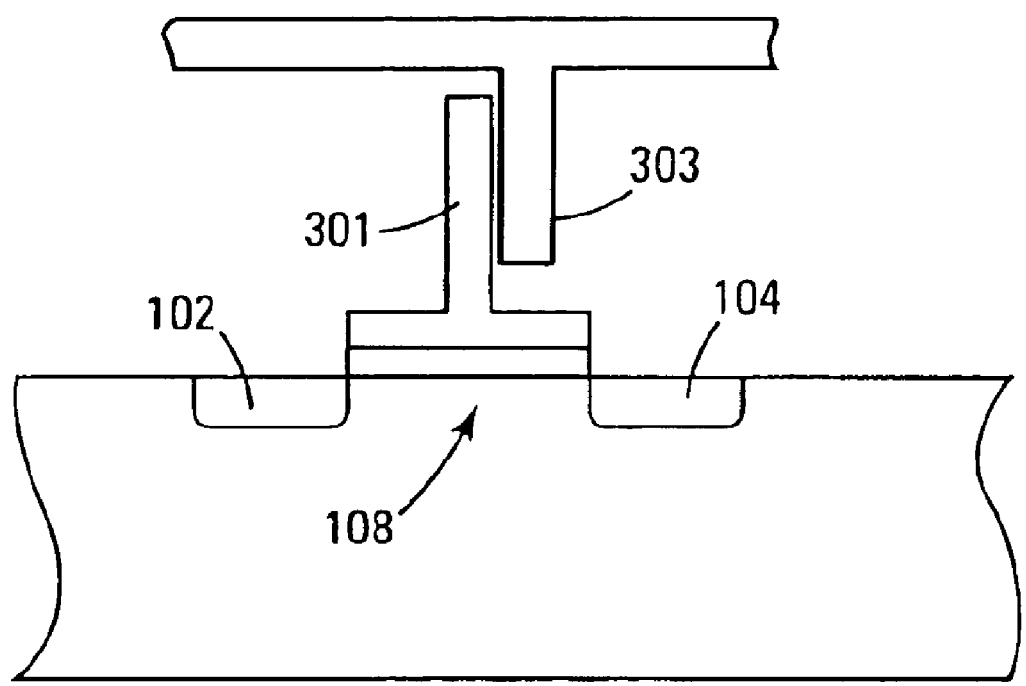
FIG. 8B is a cross-section of an alternate floating gate transistor of one embodiment of the present invention.

Referring to FIG. 8B, a cross section view of an alternate embodiment of a floating gate transistor of the present invention is illustrated. The transistor includes a source region 102 and a drain region 104 formed in a substrate. The source and drain regions are laterally spaced apart to define a channel region 108. A tunnel oxide is formed over the channel region and a floating gate 301 is formed over the tunnel oxide. The floating gate has a vertically extending portion that is operationally coupled to a control gate 303. The floating gate is different from the container embodiment described above, however, the floating gate has an increased floating gate to control gate than conventional floating gate transistors. As such, the present invention I not limited to container-shaped floating gates.

Figure 10:
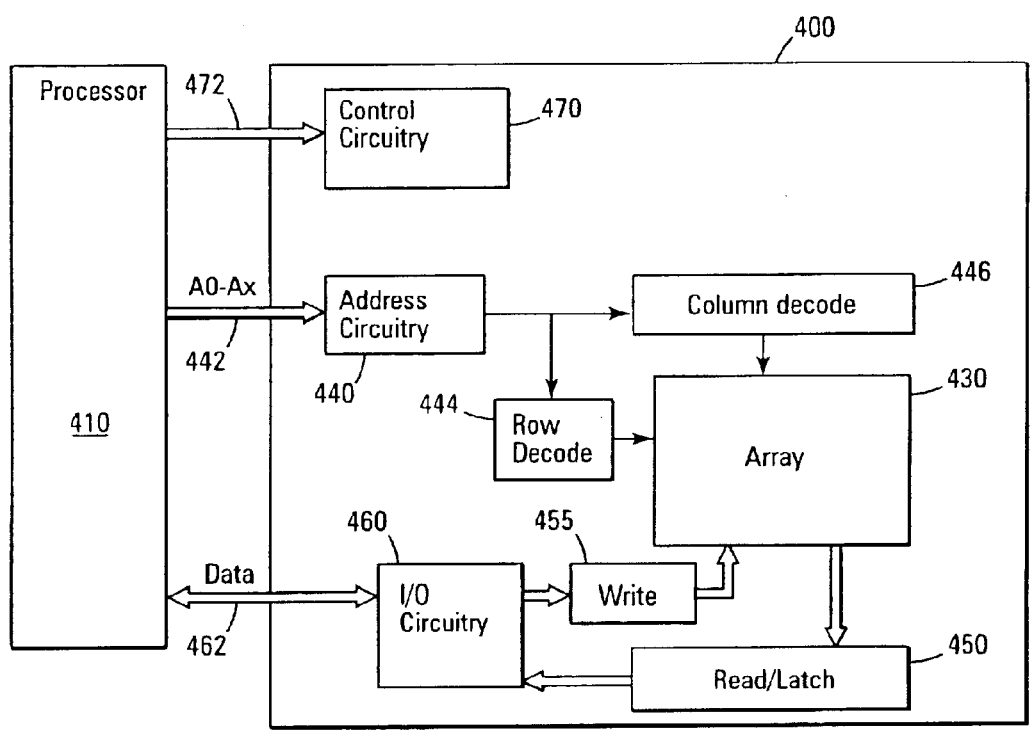
FIG. 10 is a block diagram of a memory device of an embodiment of the present invention.

FIG. 10 is a functional block diagram of a memory device 400, of one embodiment of the present invention, which is coupled to a processor 410. The memory device 400 and the processor 410 may form part of an electronic system 420. The memory device 400 has been simplified to focus on features of the memory that are helpful in understanding the present invention. The memory device includes an array of memory cells 430. The memory cells are non-volatile floating-gate memory cells with vertical floating gates. The memory array 430 is arranged in banks of rows and columns.

An address buffer circuit 440 is provided to latch address signals provided on address input connections A0–Ax 442. Address signals are received and decoded by row decoder 444 and a column decoder 446 to access the memory array 430. It will be appreciated by those skilled in the art, with the benefit of the present description, that the number of address input connections depend upon the density and architecture of the memory array. That is, the number of addresses increases with both increased memory cell counts and increased bank and block counts.

The memory device reads data in the array 430 by sensing voltage or current changes in the memory array columns using sense/latch circuitry 450. The sense/latch circuitry, in one embodiment, is coupled to read and latch a row of data from the memory array. Data input and output buffer circuitry 460 is included for bi-directional data communication over a plurality of data (DQ) connections 462 with the processor 410. Write circuitry 455 is provided to write data to the memory array.

Command control circuit 470 decodes signals provided on control connections 472 from the processor 410. These signals are used to control the operations on the memory array 430, including data read, data write, and erase operations. The flash memory device has been simplified to facilitate a basic understanding of the features of the memory. A more detailed understanding of internal circuitry and functions of flash memories are known to those skilled in the art.

CONCLUSION

A floating gate transistor has been described that includes a first floating gate structure extending horizontally over a channel region. A second floating gate structure vertically extends upwardly from the first floating gate structure to be coupled to a control gate. The second floating gate structure can be formed in a container shape with the control gate formed within the container floating gate. The transistor allows the die real estate occupied by the transistor to be reduced while maintaining the coupling area between the floating and control gates. The transistor can be used in non-volatile memory devices, such as flash memory.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming a floating gate transistor comprising:

forming laterally spaced source and drain regions to define a channel therebetween;

forming a first floating gate portion above the channel region, the first floating gate portion extending in a general horizontal direction;

forming spacers over the first floating gate portion to define an exposed region on the first floating gate portion;

forming a contact coupled to the first floating gate portion at the exposed region, the contact extending vertically above the first portion;

forming a second floating gate portion coupled to the contact, the second floating gate portion extending in a general vertical direction; and forming a control gate adjacent to the second portion.

2. The method of claim 1, wherein forming spacers comprises forming nitride spacers.

3. The method of claim 1, wherein forming the second floating gate portion comprises forming a container-shaped portion.

4. The method of claim 3, wherein forming the control gate comprises forming the control gate substantially within a center opening of the container-shaped portion.

5. A method of forming a floating gate transistor comprising:

forming laterally spaced source and drain regions to define a channel therebetween;

forming a substantially flat floating gate portion above the channel region;

forming spacers over the flat floating gate portion to define an exposed region on the flat floating gate portion;

forming a contact coupled to the flat floating gate portion at the exposed region, the contact extending vertically above the flat floating gate portion;

forming a vertically extending floating gate container portion coupled to the contact, the floating gate container portion having interior and exterior regions; and forming a control gate adjacent to the floating gate container portion.

6. The method of claim 5, wherein forming the control gate comprises forming the control gate inside the interior region of the floating gate container portion.

7. The method of claim 6, wherein forming the control gate further comprises forming the control gate adjacent to the exterior region of the floating gate container portion.

8. The method of claim 5, further comprising insulating the flat floating gate portion from the channel region.

9. The method of claim 5, wherein forming the flat floating gate portion, contact, and floating gate container portion comprises forming the flat floating gate portion, contact, and floating gate container portion from a polysilicon material.

10. The method of claim 9, wherein forming the floating gate container portion further comprises forming the floating gate container portion from a hemispherical grain (HSG) polysilicon material.

11. A method of forming a floating gate transistor comprising:

forming laterally spaced source and drain regions to define a channel therebetween;

forming a first layer of oxide over the channel;

forming a semiconductive first floating gate portion laterally extending over the first layer of oxide and above the channel;

forming a vertically extending semiconductive contact coupled to the first floating gate portion, wherein fabricating the contact comprises fabricating spacers over the first floating gate portion to define an exposed central region of a top surface of the first floating gate portion, wherein the contact is fabricated to couple to the first floating gate portion at the exposed central region;

forming a vertically extending semiconductive container coupled to the contact;

forming a second layer of oxide over the container; and forming a control gate over the second layer of oxide to provide electrical coupling to the container.

12. The method of claim 11, wherein the first floating gate portion, the contact and the container are formed using a polysilicon material.

13. The method of claim 11, wherein the control gate vertically descends into a central opening of the container.

14. The method of claim 11, wherein the first oxide layer is a tunnel oxide.

15. The method of claim 11, wherein the spacers are nitride spacers.

16. A method of forming a floating gate transistor comprising:

implanting laterally spaced source and drain regions into a substrate to define a channel therebetween;

growing a layer of tunnel oxide over the substrate;

depositing a polysilicon first floating gate portion laterally extending over the tunnel oxide and positioned above the channel;

forming a polysilicon contact over the first floating gate portion, such that the contact is coupled to the first floating gate portion, wherein forming the contact comprises forming spacers over the first floating gate portion to define an exposed central region of a top surface of the first floating gate portion, wherein the contact is coupled to the first floating gate portion at the exposed central region;

forming a polysilicon vertically extending container above the contact, such that the container is coupled to the contact;

depositing a layer of oxide over the container; and forming a polysilicon control gate over the layer of oxide, wherein the control gate vertically descends into a central opening of the container.

17. The method of claim 16 wherein the polysilicon vertically extending container comprises a hemispherical grain (HSG) polysilicon material.

* * * * *